United States Patent
Choumei et al.

(10) Patent No.: US 6,236,266 B1
(45) Date of Patent: May 22, 2001

(54) BIAS CIRCUIT AND BIAS SUPPLY METHOD FOR A MULTISTAGE POWER AMPLIFIER

(75) Inventors: Kenichiro Choumei; Kazutomi Mori; Akira Inoue; Toshio Okuda, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/444,406

(22) Filed: Nov. 22, 1999

(30) Foreign Application Priority Data

May 20, 1999 (JP) ................................ 11-140149

(51) Int. Cl.[7] ................................ H03G 5/16; H03F 3/04
(52) U.S. Cl. .................... 330/133; 330/134; 330/296; 330/310
(58) Field of Search ................................ 330/133, 134, 330/296, 310

(56) References Cited

U.S. PATENT DOCUMENTS

| | | | |
|---|---|---|---|
| 4,446,441 | * 5/1984 | Fujibayashi | 330/273 |
| 4,788,511 | * 11/1988 | Schindler | 330/277 |
| 5,432,473 | * 7/1995 | Mattila et al. | 330/133 |
| 5,942,946 | * 8/1999 | Su et al. | 330/310 |
| 6,114,911 | * 9/2000 | Iwai et al. | 330/295 |

OTHER PUBLICATIONS

Yoshimasu et al.; "A Low Distortion and High Efficiency HBT . . . DQPSK Modulation", *GaAS IC Symposium*, pp. 45–48, 1997.

* cited by examiner

*Primary Examiner*—Robert Pascal
*Assistant Examiner*—Patricia T. Nguyen
(74) *Attorney, Agent, or Firm*—Leydig, Voit & Mayer, Ltd.

(57) ABSTRACT

A bias circuit and bias supply method for a multistage power amplifier including heterojunction bipolar transistors for power amplifying a high frequency signal and suppressing an increase in Rx noise during low power output operation of the multistage power amplifier. The bias circuit outputs a control signal Vapc from an external control circuit to the base of only a first-stage amplifier HBT in the multistage power amplifier. To the base of the second and each later power amplifying stage HBT of the multistage power amplifier, the bias circuit supplies a bias current regulated by voltage stabilizers according to the control signal Vapc.

20 Claims, 6 Drawing Sheets

BIAS CIRCUIT AND BIAS SUPPLY METHOD FOR A MULTISTAGE POWER AMPLIFIER

BACKGROUND OF THE INVENTION

1. Field of the Invention

The present invention relates generally to a high frequency power amplifier such as used in a mobile telephony device, and relates more specifically to a bias circuit and to a bias supply method for a multistage power amplifier of heterojunction bipolar transistors.

2. Description of Related Art

Heterojunction bipolar transistors (HBT), which operate with a single power supply, are replacing GaAs field effect transistors (FET) and GaAs high electron mobility transistors (HEMT) in devices used for power amplification of radio frequency (RF) signals in mobile telephones and other mobile communications products. GaAs FETs and GaAs HEMTs require a negative voltage supply to the gate, and therefore require a negative voltage generator in the mobile telephone or other device in which they are used. Compared with a conventional FET, a HBT does not require a negative bias voltage, enabling a single power supply operation, and can perform on/off operations similarly to a Si-MOSFET without requiring an analog switch on the drain side. HBT amplifiers also have a high output power density, and can generate a specified rated output power from a device smaller than a conventional FET power amplifier generating the same output power. HBT devices are therefore considered promising as power elements in future mobile communication devices.

Unlike FET, HBTs are current driven devices, and require a base current supply of several 10 to 100 mA to generate the high 2W to 4W output needed for use in mobile telephones conforming to Europe's GSM (Global System for Mobile Communications) standard. However, because the output current assuring a specific output voltage in a standard CMOS device is less than several mA, it is difficult to obtain such a high base current directly from a standard Si CMOS chip. A bias circuit is therefore needed to supply base current to HBT in a HBT power amplifier. Output power control is also required in mobile telephones for the GSM as well as many other communications systems, and the bias circuit must therefore also be able to adjust output power.

Figure 8:
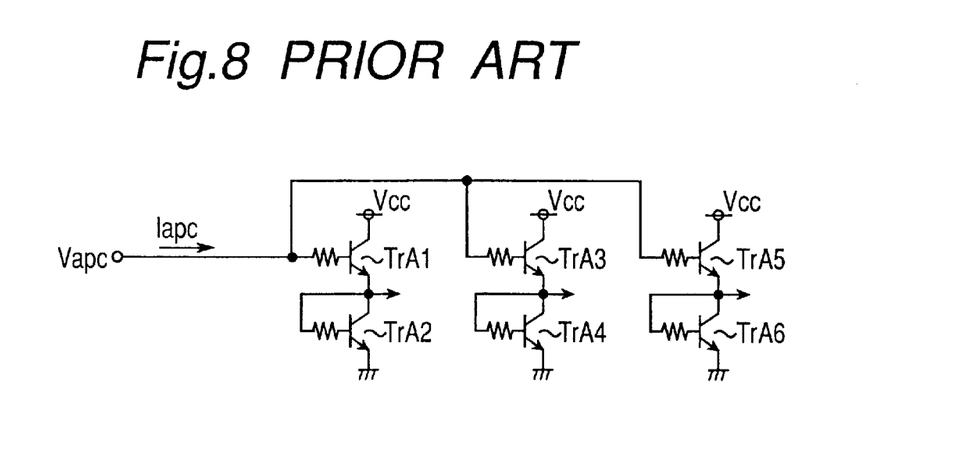
FIG. 8 is a circuit diagram of a conventional bias circuit used in a three-stage HBT power amplifier.

FIG. 8 is a circuit diagram of a conventional bias circuit in a three-stage HBT power amplifier. Referring to FIG. 8, transistors TrA1 to TrA6 are heterojunction bipolar transistors for supplying bias to a power amplifying HBT based on an input signal Vapc from a Si CMOS logic circuit such as a DA converter (not shown in the figure). Transistors TrA2, TrA4, and TrA6 can also compensate for changes in base-emitter voltage, Vbe, due to the temperature coefficient of the corresponding power amplifying HBT. Using HBT processing it is possible to form the bias circuit shown in FIG. 8 at the same time as the high frequency power amplifier, that is, the bias circuit can be integrated with the high frequency power amplifier, enabling output to be controlled according to the output voltage of the Si CMOS logic circuit.

Many current portable telephony systems also use different frequency bands for communications between a base station and the user terminal (cell phone). For example, the 900 MHz Personal Digital Cellular (PDC) cellular telephony system used in Japan uses the 940 MHz to 956 MHz band for terminal-to-base transmissions, and uses the 810 MHz to 826 MHz band for base-to-terminal transmissions. Europe's GSM 900 system, a 900 MHz band mobile telephone system, uses the 880 MHz to 915 MHz band for terminal-to-base transmissions, and uses the 935 MHz to 970 MHz band for base-to-terminal transmissions.

In communication systems that use different frequency bands for sending and receiving, noise produced in the receiving frequency band (referred to as Rx noise below) can adversely affect operation of the terminal's power amplifier during signal reception. Some means of reducing this Rx noise is therefore needed.

Figure 9:
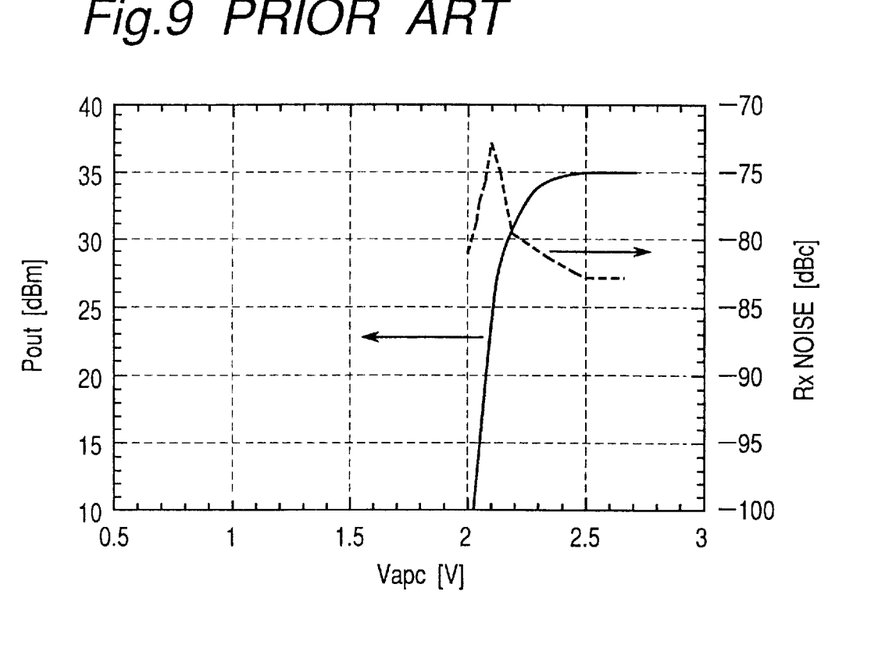
FIG. 9 is a graph showing the Rx noise characteristic in a conventional power amplifier using an HBT.

FIG. 9 is a graph of the Rx noise characteristic in a typical HBT power amplifier. As will be known from FIG. 9, Rx noise increases (at approximately Vapc=2.1 V) when the output power (Pout) of the power amplifier is reduced. It is to be noted that Rx noise is defined as the ratio between output power in the transmission frequency band and output power in the reception frequency band (935 MHz) of the power amplifier when a microwave signal in the transmission frequency band (915 MHz) only is input to the power amplifier.

Figure 10:
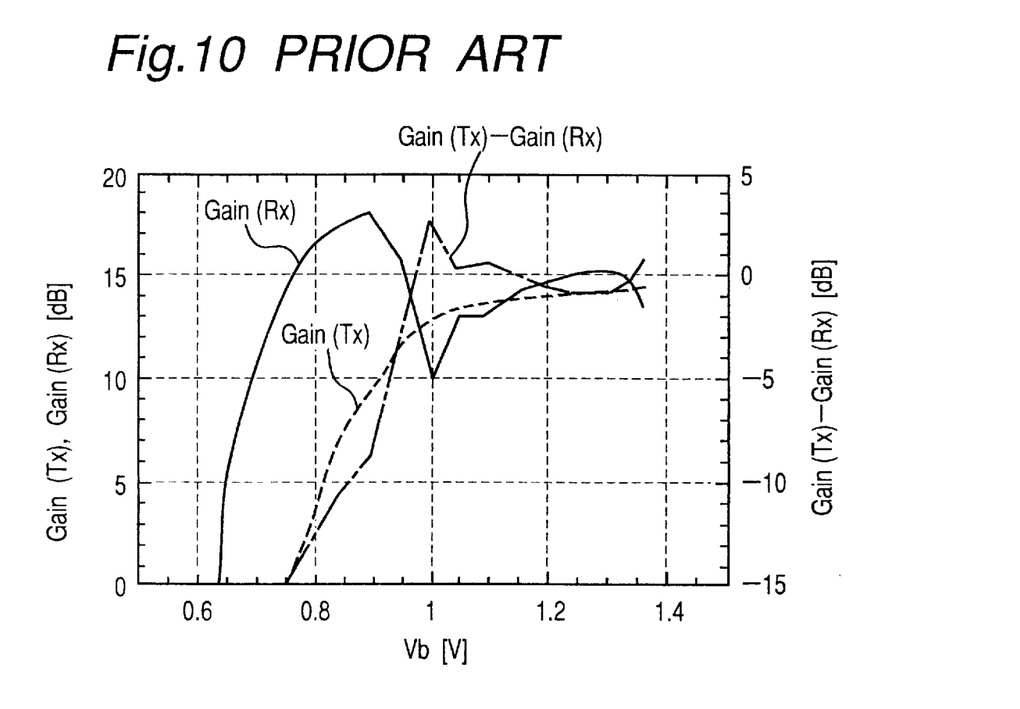
FIG. 10 is a graph showing the change in gain in the transmission and reception frequency bands for a particular bias voltage supplied to a single-stage power amplifier using an HBT.

This increase in Rx noise is unique to power amplifier HBTs. FIG. 10 is a graph of the change in gain in the transmission and reception frequency bands at a particular bias voltage in a single stage HBT power amplifier. It is to be noted that measuring Rx noise in a single stage power amplifier using the same method applied with a three-stage power amplifier is difficult due to problems relating to measurement precision. The data plotted in FIG. 10 was therefore obtained by simultaneously inputting microwave output from a synthesizer in the transmission band, and noise output from an NF measurement noise source in the reception band, to a single stage power amplifier, simultaneously measuring output in the transmission band and noise in the reception band, and expressing the results as gain. Bias was also supplied from an external rated source rather than using a bias circuit.

Referring to FIG. 10, transmission band gain Gain(Tx) drops simply in conjunction with a drop in the base voltage when power amplifier output is below the base voltage Vb (Vb<1.35 V). Note that 1.35 V is the base voltage Vb at which power amplifying HBT becomes active. Gain(Rx) in the reception band, however, declines and then rises to a characteristic peak in conjunction with a drop in the base voltage. Note that because Rx noise is defined as the ratio between output power in the transmission band and output power in the reception band, this gain characteristic is thought to be attributable to an increase in Rx noise.

A problem, therefore, is that when a constant bias is supplied to the power amplifying HBT in each stage of a multistage power amplifier, the increase in noise at each stage becomes amplified and then output.

SUMMARY OF THE INVENTION

With consideration to the above-noted problem, an object of the present invention is therefore to provide a bias circuit and a bias supply method for suppressing an increase in Rx noise when output power drops in a multistage power amplifier comprising heterojunction bipolar transistors for power amplifying high frequency signals.

To achieve the above object, a bias circuit according to the present invention for supplying a bias to a multistage power amplifier having a plurality of power amplifying heterojunction bipolar transistors (HBT) according to a control signal from a control circuit includes a first bias supplying circuit for supplying a specific bias to the first power amplifying stage HBT of the multistage power amplifier; and a second bias supplying circuit for controlling bias supply to each second and subsequent power amplifying stage HBT according to the control signal from the control circuit.

The first bias supplying circuit preferably supplies the control signal from the control circuit as bias to the first-stage power amplifying. HBT. Thus constructed, it is not necessary to provide a specific bias circuit for the first-stage power amplifying HBT, and Rx noise can be reduced during low power output operation of the power amplifier.

Alternatively, the first bias supplying circuit generates and supplies a specific constant voltage to the first-stage power amplifying HBT.

Further alternatively, the first bias supplying circuit is a voltage stabilizer for outputting a specific constant voltage when a constant voltage is supplied thereto from an external source. When thus constructed, a specific constant voltage can be stably output by means of a simple circuit design even when the base current of the first-stage power amplifying HBT changes, and Rx noise can be further reduced during low power output operation of the power amplifier.

The present invention further relates to a bias supply method of a bias circuit for supplying bias to a multistage power amplifier comprising a plurality of power amplifying heterojunction bipolar transistors (HBT) according to a control signal from a control circuit. This method has a step for supplying a specific bias to a first power amplifying stage HBT; and a step for controlling bias supply to each second and subsequent power amplifying stage HBT according to the control signal from the control circuit.

BRIEF DESCRIPTION OF THE DRAWINGS

Other objects and attainments together with a fuller understanding of the invention will become apparent and appreciated by referring to the following description and claims taken in conjunction with the accompanying drawings, in which like parts are designated by like reference numerals and in which:

DESCRIPTION OF THE PREFERRED EMBODIMENTS

The preferred embodiments of the present invention are described below with reference to the accompanying figures.

Embodiment 1

Figure 1:
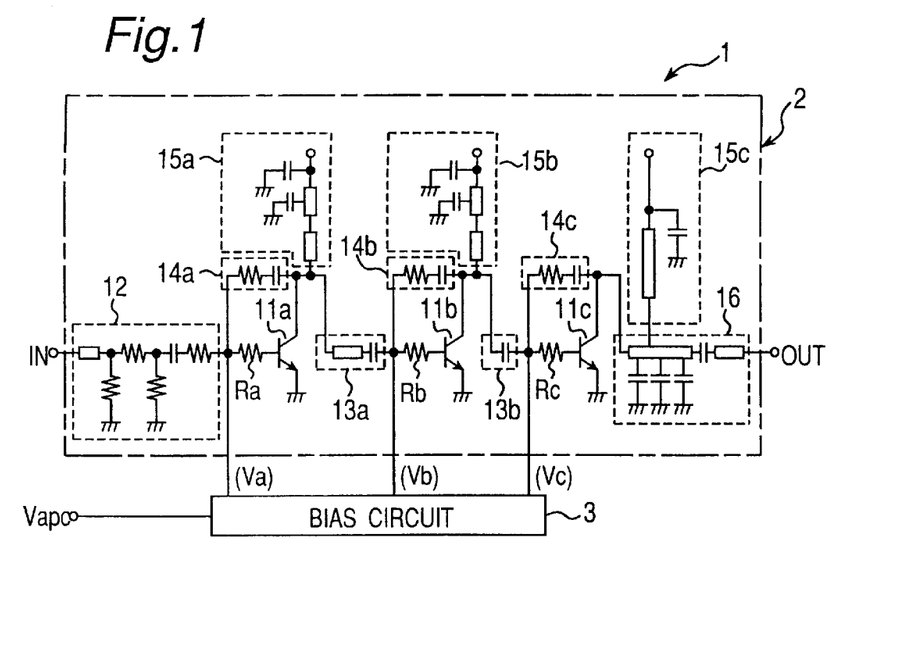
FIG. 1 is a typical circuit diagram of a high frequency power amplifier in which a bias circuit according to a first preferred embodiment of the present invention is used.

FIG. 1 is a typical circuit diagram of a high frequency power amplifier in which a bias circuit according to a first preferred embodiment of the present invention is used. It is to be noted that FIG. 1 shows a multistage power amplifier conforming to the GSM 900 system by way of example only. The high frequency power amplifier 1 shown in FIG. 1 comprises a multistage power amplifier 2 for the GSM 900 system, and a bias circuit 3 for supplying bias to the multistage power amplifier 2. Note further that this multistage power amplifier 2 uses HBTs.

The multistage power amplifier 2 comprises HBT 11a to 11c for power amplifying; input matching circuit 12; interstage matching circuits 13a and 13b; feedback circuits 14a to 14c; collector biasing circuits 15a to 15c; output matching circuit 16; and base resistors Ra to Rc for HBT 11a to 11c.

HBT 11a power amplifies a high frequency signal input from input terminal IN through input matching circuit 12. HBT 11b amplifies the high frequency signal amplified by HBT 11a and passed through interstage matching circuit 13a to HBT 11b. HBT 11c amplifies the high frequency signal amplified by HBT 11b and passed through interstage matching circuit 13b to HBT 11c. HBT 11c then passes the amplified high frequency signal through output matching circuit 16 for output from output terminal OUT. Bias from bias circuit 3 is applied to the base of each HBT 11a to 11c for the above operation.

The bias circuit 3 supplies bias to the base of each power amplifying HBT 11a to 11c based on the signal Vapc applied thereto by a Si CMOS logic circuit, such as a control circuit having a DA converter. Using an HBT process it is possible to form the bias circuit shown in FIG. 1 at the same time as the high frequency power amplifier, that is, the bias circuit can be integrated with the high frequency power amplifier.

Figure 2:
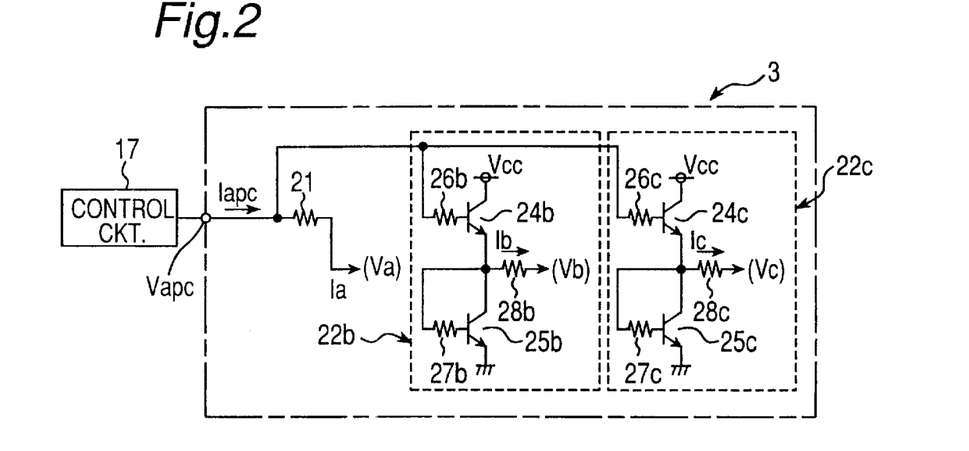
FIG. 2 is a circuit diagram of the bias circuit shown in FIG. 1.

FIG. 2 is a circuit diagram of the bias circuit 3 shown in FIG. 1. This bias circuit 3 comprises a resistor 21 and voltage stabilizers 22b and 22c, which are controlled by a signal Vapc from control circuit 17. Terminal Vapc to which signal Vapc is input is connected through resistor 21 to the base of HBT 11a, which is the first amplifying stage of the multistage power amplifier 2. This bias circuit for the first-stage amplifier is a current driven circuit. Voltage stabilizer 22b supplies bias to the base of HBT 11b, which is the second amplifying stage of the multistage power amplifier 2. Voltage stabilizer 22c supplies bias to the base of HBT 11c, which is the last amplifying stage of the multistage power amplifier 2.

Voltage stabilizer 22b comprises HBT 24b and 25b and resistors 26b to 28b. Resistor 26b is the base resistor for HBT 24b, and resistor 27b is the base resistor for HBT 25b.

The collector of HBT 24b is connected to power supply terminal Vcc to which a specific dc supply voltage is applied, and the emitter is connected to the collector of HBT 25b. A node between the HBT 24b emitter and HBT 25b collector is connected to the base of HBT 11b in multistage power amplifier 2 through intervening resistor 28b. The base of HBT 24b is connected to terminal Vapc through resistor 26b.

The base of HBT 25b is connected to its collector through resistor 27b, and the emitter is connected to ground. It is to be noted that HBT 25b enables compensation for change in the base-emitter voltage Vbe according to the temperature coefficient of HBT 11b in multistage power amplifier 2.

Voltage stabilizer 22c likewise comprises HBT 24c and 25c and resistors 26c to 28c. Resistor 26c is the base resistor for HBT 24c, and resistor 27c is the base resistor for HBT 25c.

The collector of HBT 24c is connected to power supply terminal Vcc, and the emitter is connected to the collector of HBT 25c. A node between the HBT 24c emitter and HBT 25c collector is connected to the base of HBT 11c in multistage power amplifier 2 through intervening resistor 28c. The base of HBT 24c is connected to terminal Vapc through resistor 26c.

The base of HBT 25c is connected to its collector through resistor 27c, and the emitter is connected to ground. It is to be noted that HBT 25c enables compensation for change in the base-emitter voltage Vbe according to the temperature coefficient of HBT 11c in multistage power amplifier 2.

With a bias circuit thus comprised, signal Vapc input to the bias circuit 3 passes resistor 21 and is supplied as a bias current to the base of the first-stage power amplifying HBT 11a in the multistage power amplifier 2. Bias current is also supplied to the base of HBT 11b from voltage stabilizer 22b, the operation of which is controlled by signal Vapc, and to the base of HBT 11c from voltage stabilizer 22c, the operation of which is also controlled by signal Vapc.

Figure 3A:
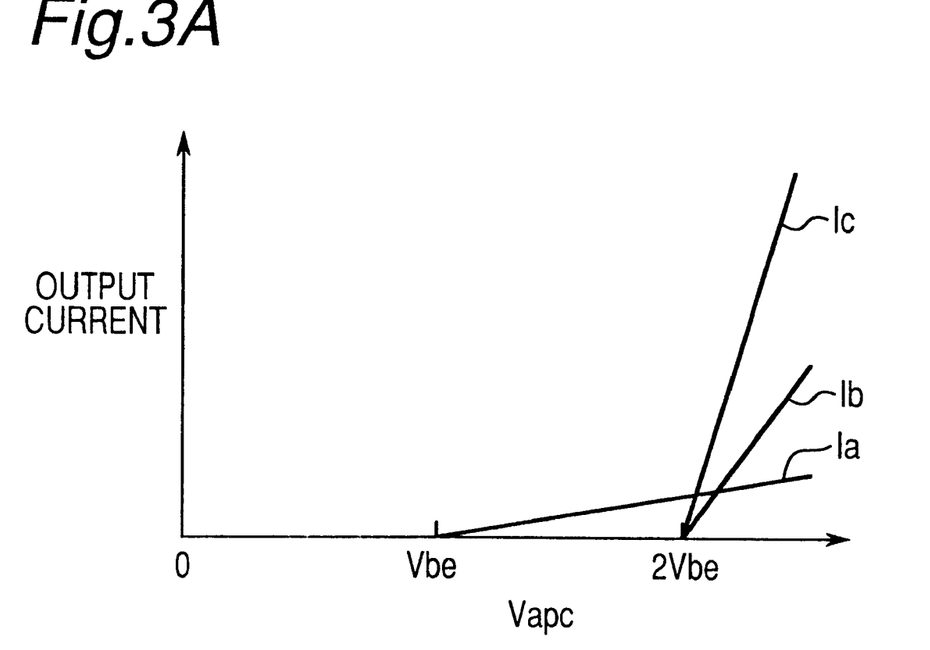
FIG. 3A is a graph showing the relationship between signal Vapc and output current Ia to Ic from the bias circuit shown in FIG. 2.
Figure 3B:
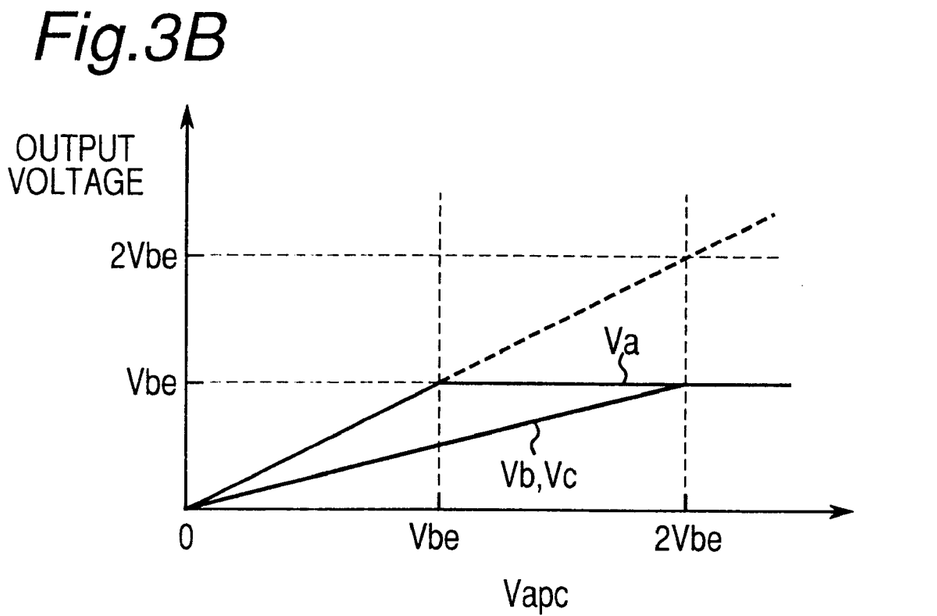
FIG. 3B is a graph showing the relationship between signal Vapc and output voltage from the bias circuit shown in FIG. 2.

FIG. 3A shows the relationship between output currents Ia to Ic from bias circuit 3 and signal Vapc. FIG. 3B shows the relationship between this signal Vapc and the output voltages from bias circuit 3. In both FIGS. 3A and 3B, Ia is the output current and Va is the output voltage to the base of HBT 11a, Ib is the output current and Vb is the output voltage to the base of HBT 11b, and Ic is the output current and Vc is the output voltage to the base of HBT 11c. Note, further, that Vbe is the threshold voltage (approximately 1.35 V) of HBTs 11a to 11c, 24b, 25b, 24c, and 25c.

Referring to FIGS. 3A and 3B, when signal Vapc≧2Vbe, bias circuit 3 supplies bias current to each of the power amplifying HBT 11a to 11c in multistage power amplifier 2 to achieve class AB operation. When Vapc<2Vbe, bias current is supplied to HBT 11a, that is, the first-stage HBT, to achieve Class AB operation, but bias current is not supplied to the base of the second-stage power amplifier HBT 11b or the third-stage (last stage) power amplifier HBT 11c. HBT 11b and HBT 11c thus operate as Class C amplifiers, and output from the multistage power amplifier 2 drops.

Figure 4:
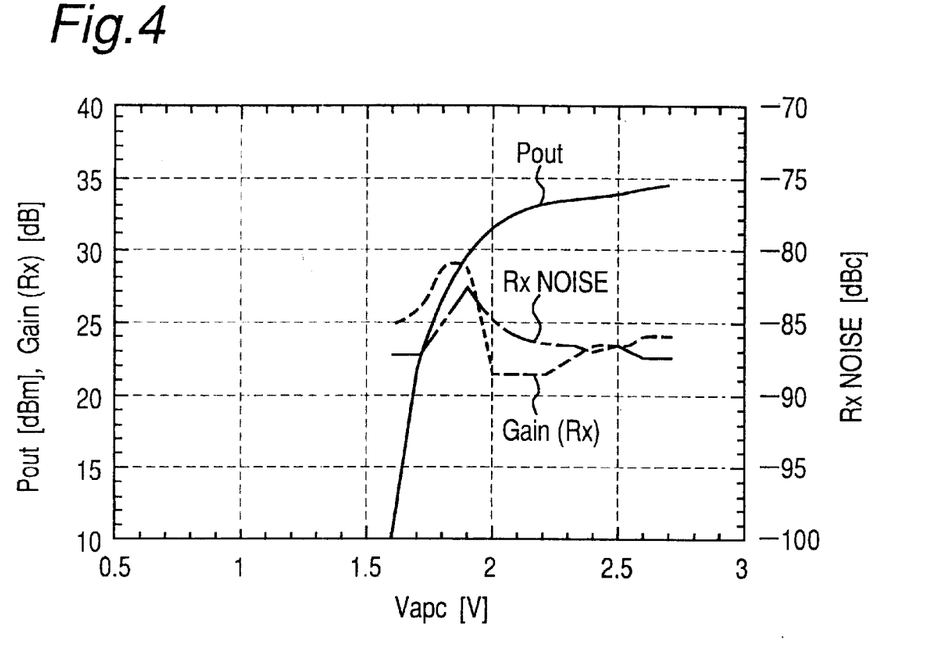
FIG. 4 is a graph showing the relationship between the Rx noise characteristic, output power characteristic, and signal Vapc from the high frequency power amplifier shown in FIG. 1.

FIG. 4 shows the relationship between the Rx noise characteristic and output power (Pout) characteristic of high frequency power amplifier 1 shown in FIG. 1 to FIG. 3B for signal Vapc. As will be known by comparing the results in FIG. 4 with those in FIG. 9, peak Rx noise is reduced from −73 dBc when Vapc is 2.1 V in the conventional amplifier to −82.5 dBc when Vapc is 1.9 V in a high frequency power amplifier 1 according to this preferred embodiment. The relationship between Rx noise and Gain(Rx) in the reception band also shows the same characteristic.

An increase in Rx noise when the output power of an HBT multistage power amplifier drops can thus be attributed to the gain characteristic when output power is low (Vb<1.35 V in this example). As previously described, Rx noise is added at each amplification stage when the bias applied to each stage of a multistage power amplifier is a uniformly determined base voltage corresponding to output from a controlling Si CMOS device.

By supplying a different base voltage to each amplifier stage based on output from the controlling Si CMOS device, however, Rx noise is not accumulated through successive amplifier stages, and output power can therefore be reduced while suppressing an increase in Rx noise. It is also possible by reducing the base voltage supplied to later-stage amplifiers to achieve low current consumption during low power output operation.

Figure 5:
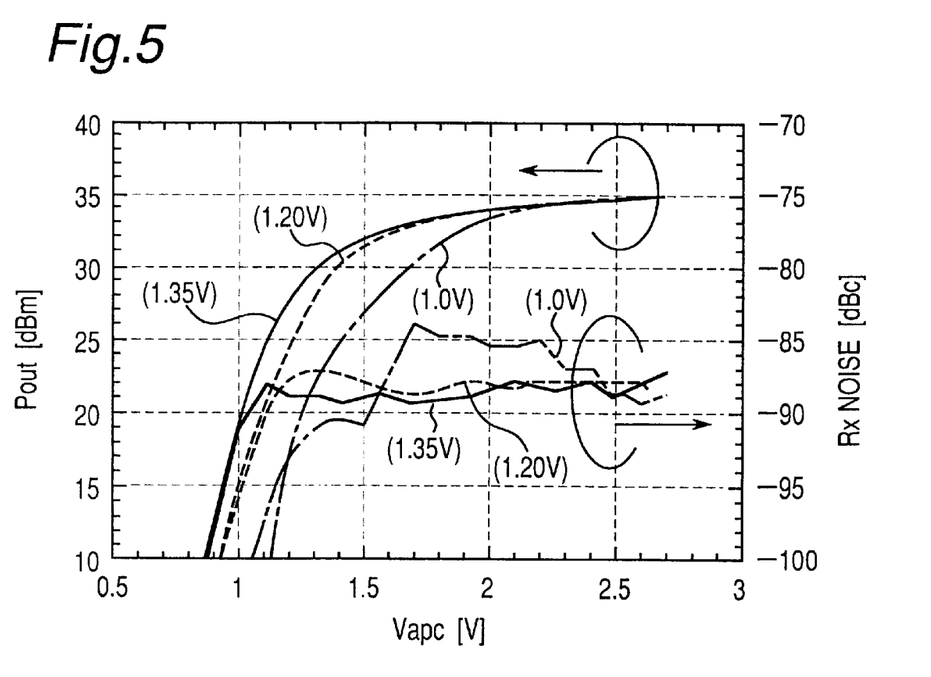
FIG. 5 is a graph showing the results of Rx noise measurements when bias current is supplied independently from an external supply to the HBT shown in FIG. 1.

FIG. 5 shows the results of Rx noise measurements obtained by supplying bias current from an independent external source instead of from the bias circuit 3 to only the first-stage HBT 11a of multistage power amplifier 2. As will be known from FIG. 5, an increase in Rx noise is observed when the bias voltage supplied to the first-stage amplifier is 1.0 V, but no increase in Rx noise is observed when the bias voltage is 1.2 V or 1.35 V. It is thus also known from FIG. 5 that Rx noise can be reduced by supplying bias to the first stage amplifier and to the second and subsequent stage amplifiers of a multistage power amplifier using different methods.

As described above, a bias circuit according to a first preferred embodiment of the present invention outputs a signal Vapc from a control circuit 17 to the base of only the first-stage amplifier HBT 11a of multistage power amplifier 2, and supplies to the base of the HBT 11b, 11c operating as second and subsequent stage amplifiers of the multistage power amplifier 2 a bias current from voltage stabilizers 22b and 22c, the operation of which is controlled by this signal Vapc. It is therefore possible to reduce Rx noise during low output power operation of the multistage power amplifier 2.

Embodiment 2

Figure 6:
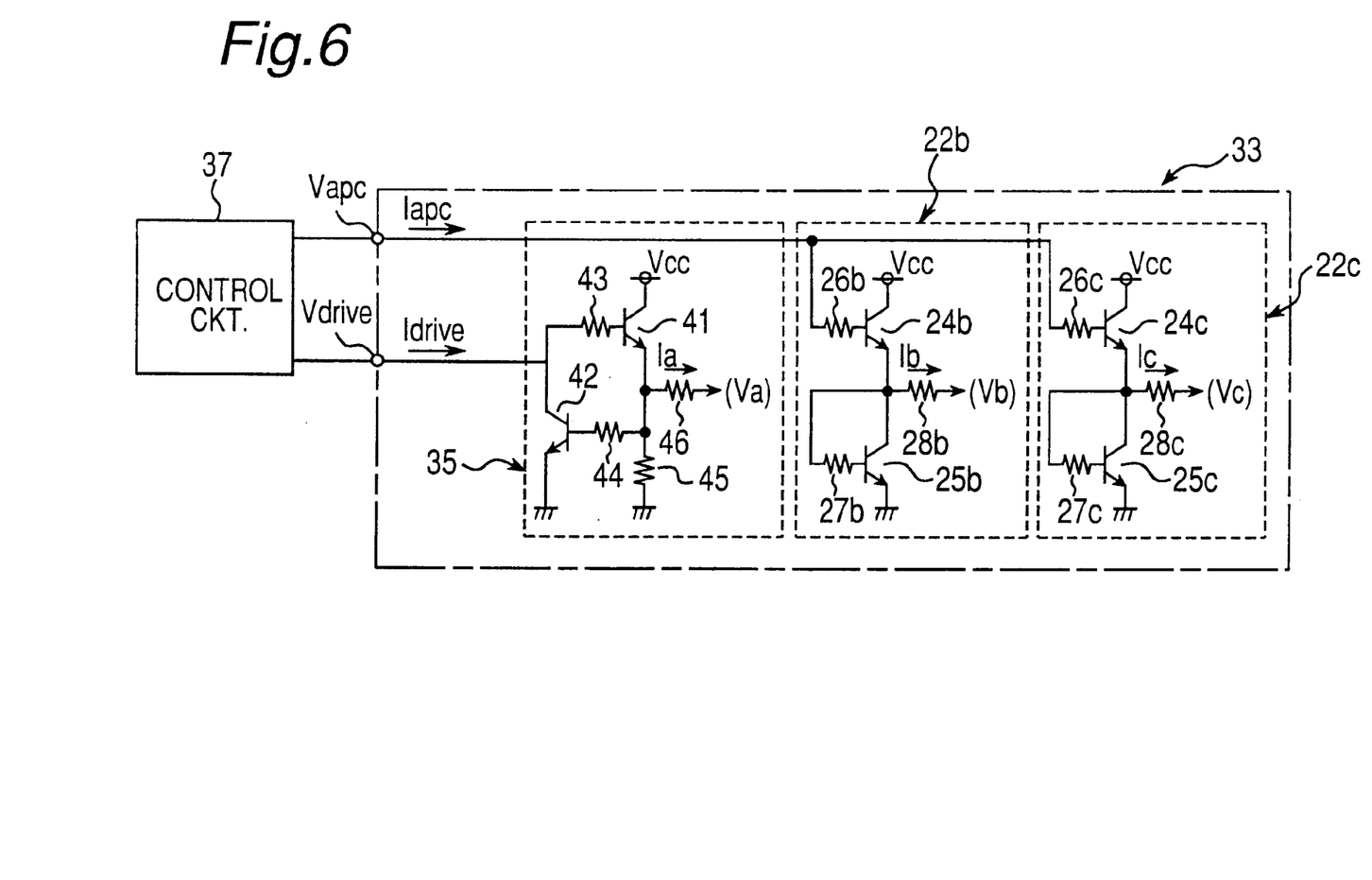
FIG. 6 is a circuit diagram of a bias circuit according to a second preferred embodiment of the present invention.

As described above, a bias circuit according to the first embodiment of the present invention supplies signal Vapc to the base of the first-stage power amplifier HBT of a multistage power amplifier. A bias supply method according to a second embodiment of the present invention differs from the above first embodiment in that it supplies a constant voltage to the base of the first-stage power amplifier HBT without reference to signal Vapc, and supplies bias current to the base of the second- and subsequent-stage power amplifier HBTs from voltage stabilizers 22b and 22c, the operation of which is controlled by this signal Vapc.

FIG. 6 is a circuit diagram of a bias circuit according to this second embodiment of the present invention. It is to be noted that a typical circuit diagram of a high frequency power amplifier using the bias circuit shown in FIG. 6 is identical to that shown in FIG. 1 except for the bias circuit reference numeral. Further description thereof is thus omitted below where FIG. 1 and FIG. 6 are referred to together. Note, further, that like parts in FIG. 2 and FIG. 6 are identified by like reference numerals, and further description thereof is omitted below where only the differences are described.

More specifically, the bias circuit 33 shown in FIG. 6 differs from that in FIG. 2 in that resistor 21 in FIG. 2 is replaced by a voltage stabilizer 35 for supplying a constant voltage irrespective of signal Vapc to HBT 11a, which is the first-stage amplifier of multistage power amplifier 2.

Referring to FIG. 6, bias circuit 33 comprises voltage stabilizer 35 and voltage stabilizers 22b and 22c. This voltage stabilizer 35 outputs a specific constant voltage while a specific constant voltage Vdrive is applied to terminal Vdrive from a Si CMOS logic circuit such as a control circuit 37 with a DA converter. Operation of the voltage stabilizers 22b and 22c is controlled by a signal Vapc input to terminal Vapc from the control circuit 37. The voltage stabilizer 35 supplies bias to the base of the above-noted HBT 11a, that is, the first-stage amplifier of multistage power amplifier 2.

This voltage stabilizer 35 comprises HBT 41 and 42 and resistors 43 to 46. Resistor 43 is a base resistor for HBT 41, and resistor 44 is a base resistor for HBT 42.

The collector of HBT 41 is connected to power supply terminal Vcc. The emitter of HBT 41 is connected through resistor 44 to the base of HBT 42, through resistor 45 to ground, and through resistor 46 to the base of HBT 11a in multistage power amplifier 2. The base of HBT 41 is connected through resistor 43 to terminal Vdrive. The collector of HBT 42 is connected to terminal Vdrive, and the emitter is to ground.

With a bias circuit thus comprised bias current is supplied from voltage stabilizer 35 to the base of first-stage amplifier HBT 11a in multistage power amplifier 2. It is to be noted that if the specific constant voltage Vdrive from control circuit 37 is applied directly to the base of HBT 11a, the bias voltage will change with respect to a change in the base current supplied to HBT 11a. Constant voltage Vdrive is therefore passed through voltage stabilizer 35 to apply a constant voltage to the base of HBT 11a.

Figure 7:
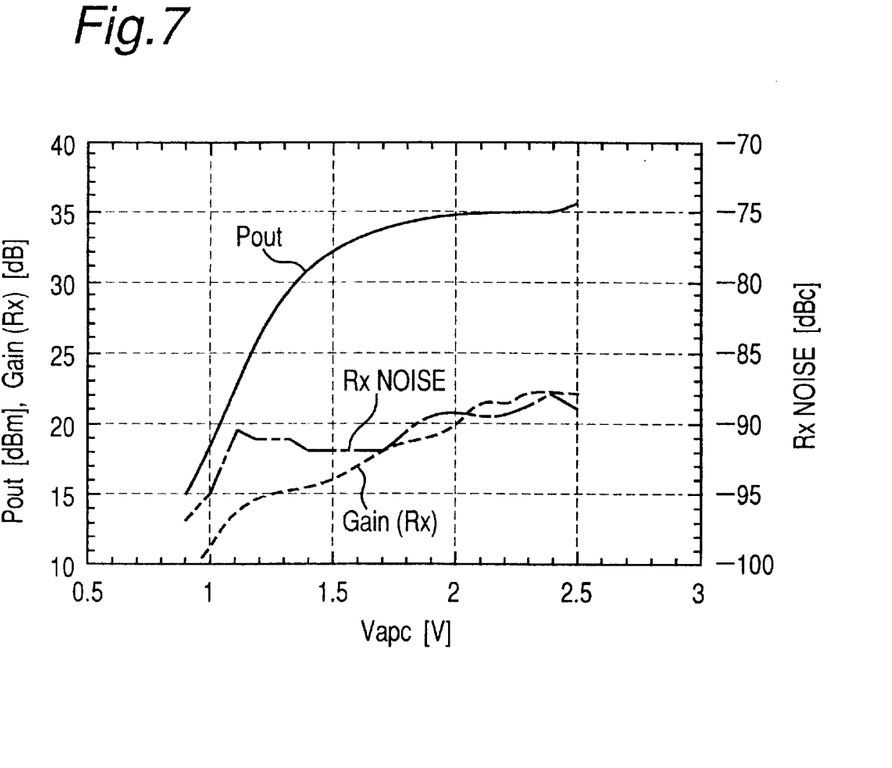
FIG. 7 is a graph showing the relationship between the Rx noise characteristic, output power characteristic, and signal Vapc using the bias circuit shown in FIG. 6.

FIG. 7 is a graph showing the relationship between the Rx noise characteristic, output power, and signal Vapc in a high frequency power amplifier 1 using the bias circuit 33 shown in FIG. 6.

As will be known by comparing the results in FIG. 7 with those in FIG. 9, peak Rx noise is reduced from −73 dBc when Vapc is 2.1 V in the conventional amplifier to −89.3 dBc when Vapc is 2.1 V in a high frequency power amplifier 1 according to this preferred embodiment.

It is to be further noted that also constant voltage Vdrive and signal Vapc are described as supplied from a control circuit in this exemplary second embodiment of the invention, they can be alternatively supplied from separate external circuits.

As described above, a bias circuit according to this second preferred embodiment of the present invention supplies a constant voltage bias from a voltage stabilizer 35 to the first-stage amplifier HBT 11a in multistage power amplifier 2 without reference to signal Vapc, and supplies bias current from voltage stabilizers 22b and 22c, which are controlled by signal Vapc, to the base of the laterstage amplifier HBTs 11b and 11c of multistage power amplifier 2. It is therefore possible to further reduce Rx noise during low output power operation of multistage power amplifier 2.

Although the present invention has been described in connection with the preferred embodiments thereof with reference to the accompanying drawings, it is to be noted that various changes and modifications will be apparent to those skilled in the art. For example, bias circuits according to the preferred first and second embodiments above have been described by way of example only as comprising HBTs. It will be obvious, however, that a bias circuit according to the present invention can be achieved using such other types of transistors as Si-MOSFET and Si bipolar transistors.

In addition, bias circuits according to the preferred first and second embodiments above have been described with reference to a high frequency power amplifier used in mobile telephony terminals by way of example only, and can obviously be used in amplifiers for other applications.

It will also be obvious that when the external control circuit (Si CMOS circuit) has a plurality of outputs, Rx noise can be further reduced by supplying bias to the bias circuits so that output drops in sequence from the last stage of the multistage power amplifier 2.

Such changes and modifications are to be understood as included within the scope of the present invention as defined by the appended claims, unless they depart therefrom.

What is claimed is:

1. A bias circuit for a multistage power amplifier comprising a plurality of power amplifying heterojunction bipolar transistors (HBTs) connected in first and second power amplifying stages, the bias circuit applying a bias to the first and second stages in response to a control signal applied to the bias circuit by a control circuit, the bias circuit comprising:

a first bias supplying circuit for supplying a first bias current to a first stage power amplifying HBT only when the control signal exceeds a first threshold; and a second bias supplying circuit for supplying a second bias current to a second stage power amplifying HBT only when the control signal supplied by the control circuit exceeds a second threshold larger than the first threshold.

2. The bias circuit according to claim 1, wherein the first bias supplying circuit directly applies the control signal from the control circuit to supply the first bias current to the first stage power amplifying HBT.

3. A bias circuit for a multistage power amplifier comprising a plurality of power amplifying heterojunction bipolar transistors (HBTs) connected in first and second power amplifying stages, the bias circuit applying a bias to the first and second stages in response to a control signal applied to the bias circuit by a control circuit, the bias circuit comprising:

a first bias supplying circuit generating and supplying a constant voltage to a first stage power amplifying HBT as a first bias; and a second bias supplying circuit for supplying a second bias to a second stage power amplifying HBT in response to the control signal supplied by the control circuit.

4. The bias circuit according to claim 3, wherein the first bias supplying circuit comprises a voltage stabilizer for outputting a constant voltage when a constant voltage is supplied to the voltage stabilizer from an external source.

5. A method for supplying bias to a multistage power amplifier comprising a plurality of power amplifying heterojunction bipolar transistors (HBTs) connected in first and second power amplifying stages, the bias circuit applying a bias to the first and second stages in response to a control signal applied to the bias circuit by a control circuit, the method comprising:

supplying a first bias current to a first stage power amplifying HBT only when the control signal exceeds a first threshold; and supplying a second bias current to a second stage power amplifying HBT only when the control signal supplied by the control circuit exceeds a second threshold larger than the first threshold.

6. The method for supplying bias according to claim 5, including directly applying the control signal from the control circuit to supply the first bias current to the first stage power amplifying HBT.

7. A method for supplying bias to a multistage power amplifier comprising a plurality of power amplifying heterojunction bipolar transistors (HBTs) connected in first and second power amplifying stages, the bias circuit applying a bias to the first and second stages in response to a control signal applied to the bias circuit by a control circuit, the method comprising:

generating and supplying a constant voltage as a first bias to a first stage power amplifying HBT;and supplying a second bias to a second power amplifying stage HBT in response to the control signal supplied by the control circuit.

8. The bias circuit according to claim 1, wherein the first bias supplying circuit supplies a bias voltage to the first stage power amplifying HBT that increases in proportion to the control signal when the control signal is smaller than the first threshold and is constant when the control signal is larger than the first threshold and smaller than the second threshold and the second bias supplying circuit supplies a bias voltage to the second stage power amplifying HBT that increases in proportion to the control signal when the control signal is larger than the first threshold and does not exceed the second threshold.

9. The bias circuit according to claim 8, wherein the first bias supplying circuit directly applies the control signal from the control circuit as the first bias to the first stage power amplifying HBT.

10. The bias circuit according to claim 1, wherein the first bias current and the second bias current increase at respective, different rates in proportion to an increase in the control signal.

11. The bias circuit according to claim 1, wherein the first bias supplying circuit supplies a bias voltage to the first stage power amplifying HBT that increases in proportion to the control signal when the control signal is smaller than the first threshold and is constant when the control signal is larger than the first threshold and smaller than the second threshold, and the second bias supplying circuit supplies a bias voltage to the second stage power amplifying HBT that increases in proportion to the control signal when the control signal does not exceed the second threshold.

12. The bias circuit according to claim 11, including a third bias supplying circuit for supplying a third bias current to a third stage power amplifying HBT only when the control signal supplied by the control circuit exceeds the second threshold.

13. The bias circuit according to claim 12, wherein the first bias current and the second and third bias currents increase at respective, different rates in response to an increase in the control signal.

14. The bias circuit according to claim 12, wherein the first bias supplying circuit supplies a bias voltage to the first stage power amplifying HBT that increases in proportion to the control signal when the control signal is smaller than the first threshold and is constant when the control signal is larger than the first threshold and smaller than the second threshold, and the second and third bias supplying circuits supply bias voltages to the second and third stage power amplifying HBTs that increase in proportion to the control signal when the control signal does not exceed the second threshold.

15. The method for supplying a bias according to claim 5, wherein the first bias supplying circuit supplies a bias voltage to the first stage power amplifying HBT that increases in proportion to the control signal when the control signal is smaller than the first threshold and is constant when the control signal is larger than the first threshold and smaller than the second threshold and the second bias supplying circuit supplies a bias voltage to the second stage power amplifying HBT that increases in proportion to the control signal when the control signal is larger than the first threshold and does not exceed the second threshold.

16. The method for supplying bias according to claim 5, wherein the first bias current and the second bias current increase at respective, different rates in proportion to an increase in the control signal.

17. The bias circuit according to claim 5, wherein the first bias supplying circuit supplies a bias voltage to the first stage power amplifying HBT that increases in proportion to the control signal when the control signal is smaller than the first threshold and is constant when the control signal is larger than the first threshold and smaller than the second threshold, and the second bias supplying circuit supplies a bias voltage to the second stage power amplifying HBT that increases in proportion to the control signal when the control signal does not exceed the second threshold.

18. The method for supplying a bias according to claim 17, including a third bias supplying circuit for supplying a third bias current to a third stage power amplifying HBT only when the control signal supplied by the control circuit exceeds the second threshold.

19. The method for supplying a bias according to claim 18, wherein the first bias current and the second and third bias currents increase at respective, different rates in response to an increase in the control signal.

20. The method for supplying a bias according to claim 18, wherein the first bias supplying circuit supplies a bias voltage to the first stage power amplifying HBT that increases in proportion to the control signal when the control signal is smaller than the first threshold and is constant when the control signal is larger than the first threshold and smaller than the second threshold, and the second and third bias supplying circuits supply bias voltages to the second and third stage power amplifying HBTs that increase in proportion to the control signal when the control signal does not exceed the second threshold.

* * * * *